US011139630B2

(12) United States Patent
Sizemore

(10) Patent No.: US 11,139,630 B2
(45) Date of Patent: Oct. 5, 2021

(54) METHODS AND MATERIALS FOR CONDUIT APPARATUS AND ELECTRICAL ENCLOSURES

(71) Applicant: David Scott Sizemore, Hamilton, OH (US)

(72) Inventor: David Scott Sizemore, Hamilton, OH (US)

(73) Assignee: ELECTRA SHIELD, INC., Hamilton, OH (US)

( * ) Notice: Subject to any disclaimer, the term of this patent is extended or adjusted under 35 U.S.C. 154(b) by 0 days.

(21) Appl. No.: 16/729,611

(22) Filed: Dec. 30, 2019

(65) Prior Publication Data

US 2021/0203116 A1    Jul. 1, 2021

(51) Int. Cl.
| | |
|---|---|
| *H01R 43/24* | (2006.01) |
| *C08L 69/00* | (2006.01) |
| *B29C 45/73* | (2006.01) |
| *C09C 1/48* | (2006.01) |
| *C08F 110/02* | (2006.01) |
| *B29C 45/14* | (2006.01) |
| *H02B 1/30* | (2006.01) |
| *H05K 9/00* | (2006.01) |
| *G06F 1/18* | (2006.01) |

(52) U.S. Cl.
CPC ....... *H01R 43/24* (2013.01); *B29C 45/14639* (2013.01); *B29C 45/7312* (2013.01); *C08F 110/02* (2013.01); *C08L 69/005* (2013.01); *C09C 1/48* (2013.01); *G06F 1/181* (2013.01); *H02B 1/305* (2013.01); *H05K 9/0073* (2013.01)

(58) Field of Classification Search
CPC .............. H01R 43/24; B29C 45/14639; B29C 45/7312; C08F 110/02; C08L 69/005; C09C 1/48; H02B 1/305; H02B 1/50; G06F 1/181; H05K 7/18; H05K 9/0073
See application file for complete search history.

(56) References Cited

U.S. PATENT DOCUMENTS

| | | | | |
|---|---|---|---|---|
| 4,537,459 A | * | 8/1985 | Brennan | ............ H01R 13/6592 439/607.02 |
| 5,438,482 A | * | 8/1995 | Nakamura | ........... H05K 9/0037 174/371 |

(Continued)

*Primary Examiner* — Tho D Ta
(74) *Attorney, Agent, or Firm* — Basil M. Angelo; Angelo IP

(57) ABSTRACT

An enclosure and a method of making the enclosure is provided that includes mixing stainless steel, rubber, and polycarbonate to produce a material mixture that is electrically conductive. Carbon black powder and polyethylene are blended to produce an electrically resistive additive for dissipating static electricity. At least one injection mold for the enclosure is positioned in fluid communication with an exit end of a heating barrel. The weatherproof material mixture is injected into an entry end of the heating barrel to produce a melted weatherproof material mixture. The electrically resistive additive is introduced through a lateral port of the heating barrel proximate to the exit end to partially mix with the melted weatherproof material mixture to produce an injection mixture. The injection mixture into the at least one injection mold to produce the enclosure that is weatherproof, electrically conductive, and electrically resistive.

9 Claims, 6 Drawing Sheets

(56) References Cited

U.S. PATENT DOCUMENTS

| | | | | |
|---|---|---|---|---|
| 5,565,656 A | * | 10/1996 | Mottahed | H05K 9/0073 174/372 |
| 5,641,296 A | * | 6/1997 | Larabell | G06F 1/184 439/157 |
| 6,274,808 B1 | * | 8/2001 | Cercioglu | H05K 9/0032 174/371 |
| 6,806,422 B1 | * | 10/2004 | Rivers | H02B 1/50 174/50 |
| 6,963,495 B1 | * | 11/2005 | Carullo | H05K 7/1425 174/382 |
| 2004/0227437 A1 | * | 11/2004 | Newton, Jr. | H05K 7/18 312/287 |

* cited by examiner

SECTION A-A

METHODS AND MATERIALS FOR CONDUIT APPARATUS AND ELECTRICAL ENCLOSURES

BACKGROUND

1. Technical Field

The present disclosure generally relates to enclosures for electrical equipment, and more specifically to weather resistant enclosures for electrical equipment that include electrical grounding.

2. Description of the Related Art

Electrical enclosures are used to protect telecommunication, gas and electrical power equipment individuals from the potential hazards within the enclosures and to prevent inadvertent access. Steel enclosures are prevalently used for their strength and electrical conductivity. The enclosure can be attached to an electrical ground conductor to mitigate electrical shock hazards. When installed outdoors, steel electrical equipment enclosures require periodic inspections and maintenance due to deterioration of seals and rusting of metal. Areas near the ocean or near roads that are frequently salted during winter driving season can pose a particular challenge to using steel electrical enclosures.

The exposure to the elements dramatically reduces the expected life of a standard steel enclosure. As the enclosure deteriorates there is an increased chance of electrical shock and hazard. In order to prevent the risk of electrical shock, enclosures are regularly inspected for corrosion and deterioration. As these issues are found the enclosures are replaced. Corrosion prevention programs have been developed that required painting the enclosures on frequent basis. The inspection, maintenance, and failure of some of these enclosures increase the risk to the public and those required to work around the electrical enclosures.

Other commonly used enclosures are made from non-ferrous steel such as stainless steel to prevent corrosion of the enclosure. This method while effective in providing a groundable enclosure it significantly increases the cost of the enclosure.

Other outdoor enclosures that are subjected to water and salt are often made from plastic. Many materials used for such applications can endure a lengthy exposure to sun, water and temperatures without allowing water intrusion. Plastic, however, is not an electrically conductive material and thus is not suitable for applications that require electrical grounding of an enclosure. Many enclosures are required to be grounded in order to safely work and access the enclosure. As a result plastic enclosures are not used for these types of applications.

U.S. Pat. No. 4,163,939A describes an anti-static plastic enclosure for utility meter have an additional component on the cover of the electric enclosure to reduce the hazards of static electricity build up in the plastic enclosure U.S. Pat. No. 5,148,348 describes a polymeric enclosure for electrical apparatus that permanently molds electrically conductive connectors into the enclosure. The fixturing of additional conductive components in the enclosure increasing the complication of the molding process and limits the ability to discharge static electricity to only these portions of the enclosure. It is desirable to have an enclosure with more comprehensive conductive properties.

BRIEF SUMMARY

In one aspect of the present disclosure, an enclosure includes a molded housing having a mounting location for a ground conductor and an enclosure cover that closes an opening in the molded housing. Each of the enclosure housing and enclosure cover comprise a mix of: (i) stainless steel powder; (ii) latex rubber powder; and (iii) polycarbonate powder that are mixed and melted to produce material mixture that is electrically conductive and weatherproof, with an electrically conductive additive for controlled the dissipation of static electricity of blended: (i) carbon black powder; and (ii) polyethylene immediately prior to molding.

In another aspect of the present disclosure, a method includes mixing: (i) stainless steel powder; (ii) latex rubber powder; and (iii) polycarbonate powder to produce a material mixture that is electrically conductive and weatherproof. The method includes blending: (i) carbon black powder; and (ii) polyethylene to produce an electrically resistive additive for dissipating static electricity. The method includes positioning at least one injection mold for an enclosure in fluid communication with an exit end of a heating barrel. The method includes injecting the weatherproof material mixture into an entry end of the heating barrel to produce a melted weatherproof material mixture. The method includes introducing the electrically resistive additive through a lateral port of the heating barrel proximate to the exit end. During a short duration in the heating barrel, the electrically conductive additive partially mixes with the melted weatherproof material mixture to produce an injection mixture. The method includes injecting the injection mixture into the at least one injection mold to produce at least a portion of the enclosure that is weatherproof, electrically conductive, and electrically resistive.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
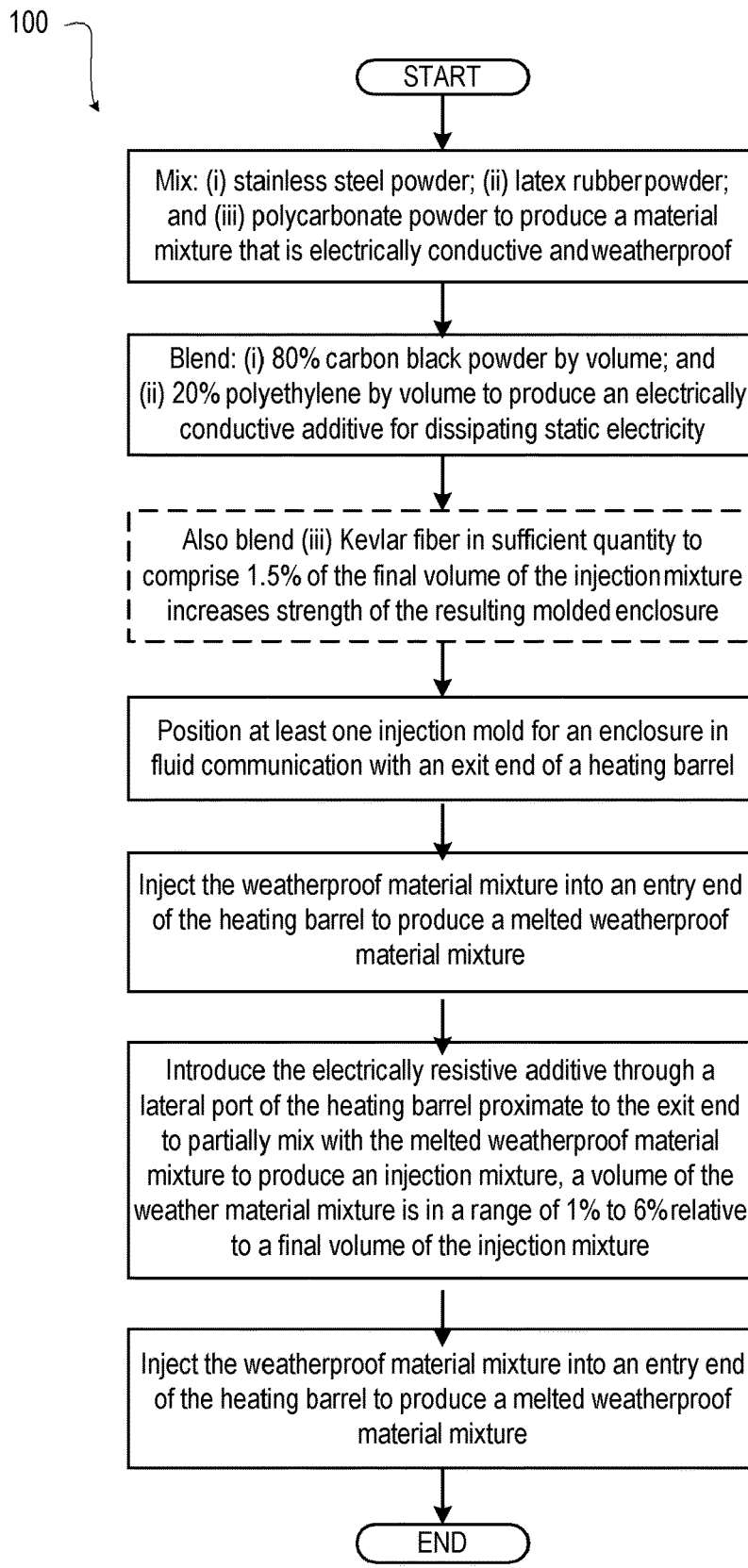
FIG. 1 is a flow diagram of a method for making an electrically groundable and weather resistant enclosure that does not accumulate static electricity, according to one or more embodiments.

According to aspects of the present disclosure, an enclosure and a method of making the enclosure is provided that includes mixing conductive powder, rubber powder, and polycarbonate powder to produce a material mixture that is electrically conductive and weatherproof. The conductive powder can contain a number of electrically conductive materials, such as carbon black or a powdered form of a ferrous, or conductive non-ferrous materials such as copper, aluminum or nickel-based metals. Carbon black powder and polyethylene are blended to produce an electrically conductive mixture for dissipating static electricity. At least one injection mold for the enclosure is positioned in fluid communication with an exit end of a heating barrel. The mixture being principle based of a polyethylene is resistant to corrosion and can be considered a weatherproof material. The weatherproof material mixture is injected into an entry end of the heating barrel to produce a melted weatherproof material mixture. The electrically conductive additive is introduced through a lateral port of the heating barrel proximate to the exit end to partially mix with the melted weatherproof material mixture to produce an injection mixture. The injection mixture into the at least one injection mold to produce the enclosure that is weatherproof, electrically conductive, and electrically resistive.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

FIG. 1 is a flow diagram of a method 100 for making an electrically groundable and weather resistant enclosure that does not accumulate static electricity. In one or more embodiments, the method 100 includes mixing: (i) stainless steel powder; (ii) latex rubber powder; and (iii) polycarbonate powder to produce a material mixture that is electrically conductive and weatherproof (block 102). The method 100 includes blending: (i) 80% carbon black powder by volume; and (ii) 20% polyethylene by volume to produce an electrically resistive additive for dissipating static electricity (block 104). The ratio of carbon black to polyethylene can be increased in order to continue to reduce the conductivity of the enclosure up to a 90% carbon to 10% polyethylene, In one or more embodiments, the method 100 includes also blending (iii) Kevlar fiber in sufficient quantity to comprise 0.5% to 5% of the final volume of the injection mixture increases strength of the resulting molded enclosure (block 106). Method 100 includes positioning at least one injection mold for an enclosure in fluid communication with an exit end of a heating barrel (block 108). Method 100 includes injecting the weatherproof material mixture into an entry end of the heating barrel to produce a melted weatherproof material mixture (block 110). Method 100 includes introducing the electrically resistive additive through a lateral port of the heating barrel proximate to the exit end to partially mix with the melted weatherproof material mixture to produce an injection mixture. In one or more embodiments, a volume of the weather material mixture is in a range of 1% to 6% relative to a final volume of the injection mixture (block 112). Method 100 includes injecting the injection mixture into the at least one injection mold to produce at least a portion of the enclosure that is weatherproof, electrically conductive, and electrically resistive (block 114). Then method 100 ends.

In one or more embodiments, the mixing material typically found in the powder form could be provided in other forms, such as pellets, fibers, or other forms that allow the ease of handling and manufacturing.

In one or more embodiments, the stainless steel powder could be replaced with other conductive material such as nickel based, copper based, titanium based, or standard ferrous materials. The materials conductive properties allow for the enclosure to maintain its conductive properties.

Figure 2:
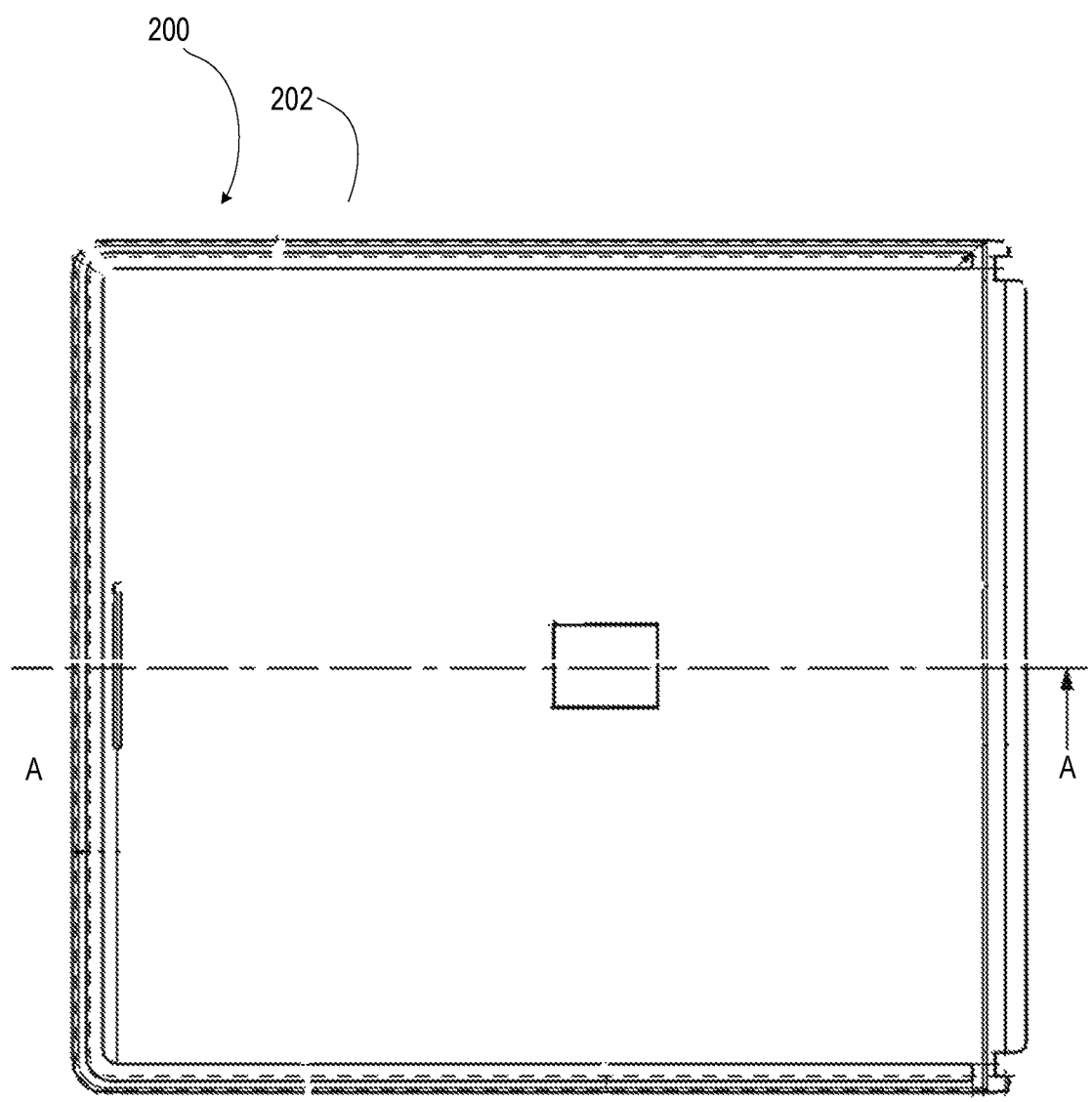
FIG. 2 is front view of the cover of an enclosure, according to one or more embodiments.
Figure 3:
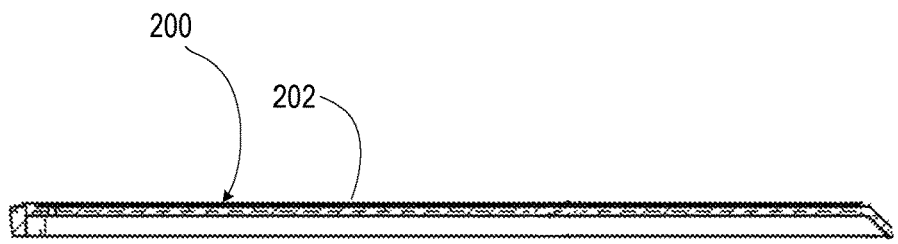
FIG. 3 is horizontal cross section along lines A-A of the cover of FIG. 2, according to one or more embodiments.
Figure 4:
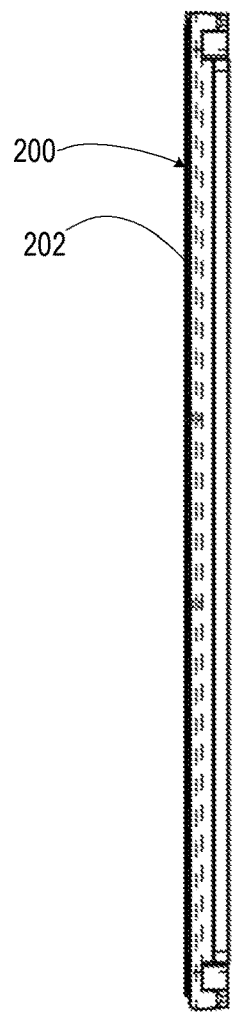
FIG. 4 right side view of cover of FIG. 2, according to one or more embodiments.
Figure 5:
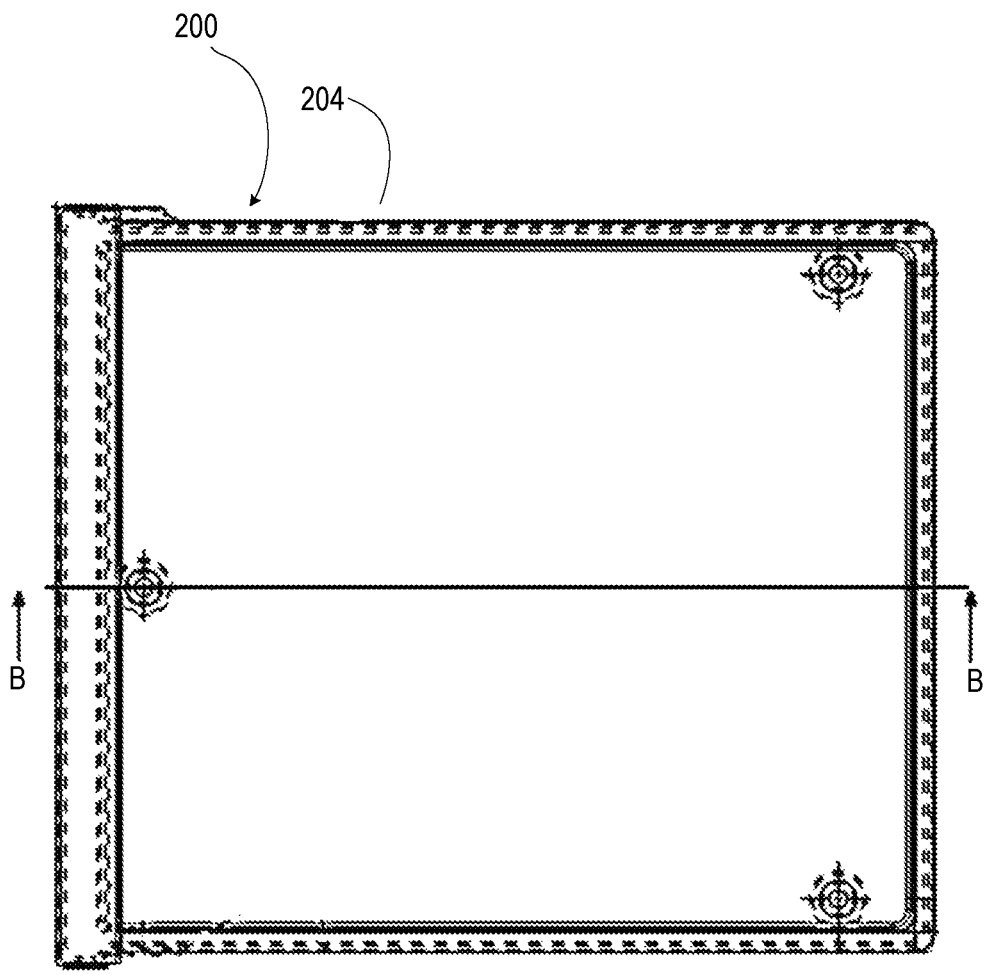
FIG. 5 front view of a housing of enclosure, according to one or more embodiments.
Figure 6:
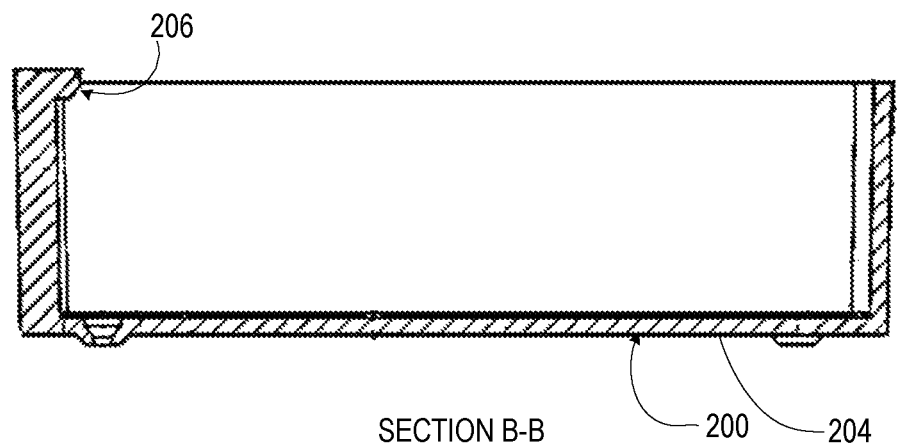
FIG. 6 is a horizontal cross section along lines B-B of the housing of FIG. 5, according to one or more embodiments.
Figure 7:
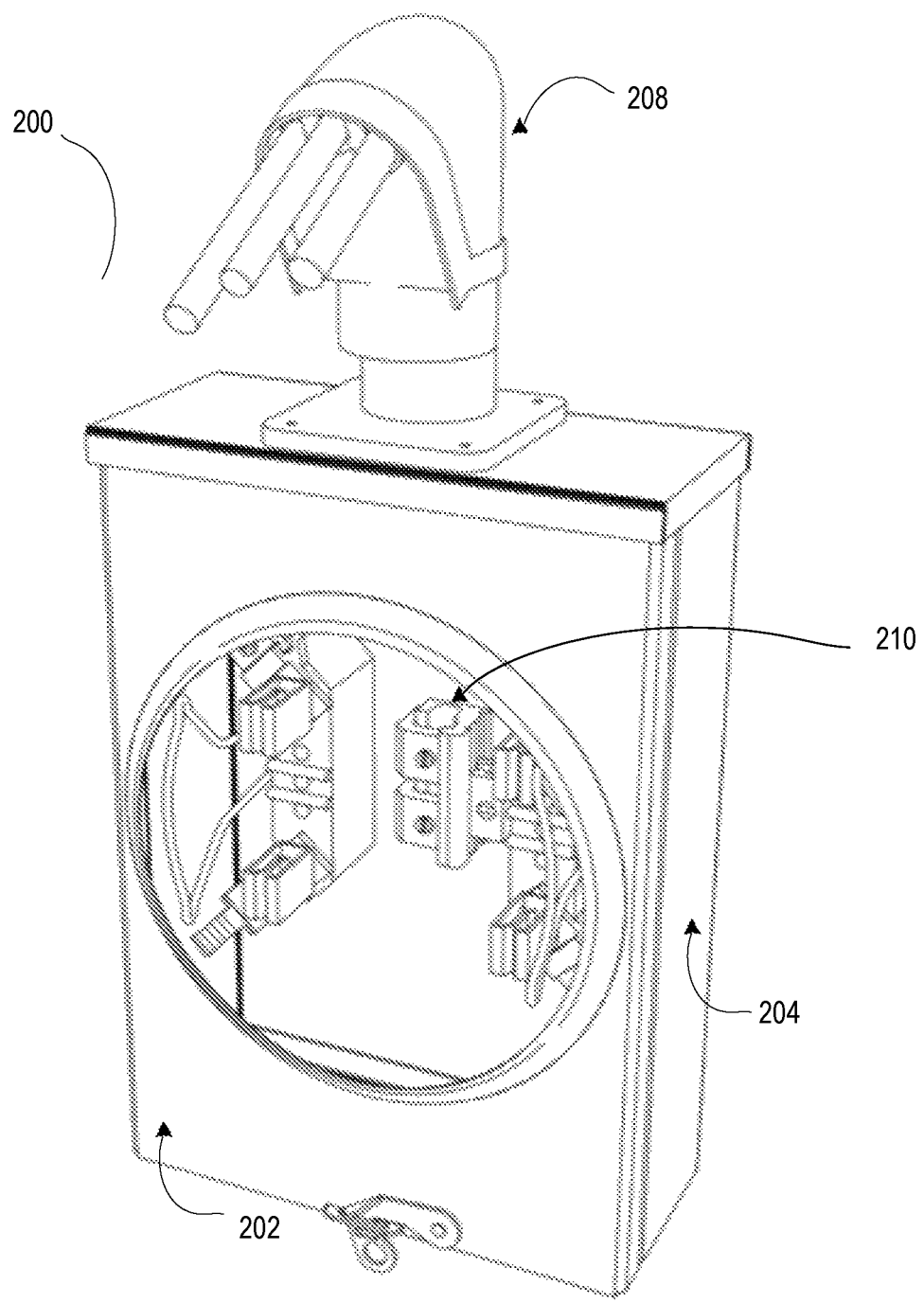
FIG. 7 is an isometric view of an electrically conductive enclosure FIG. 5, according to one or more embodiments.
Figure 8:
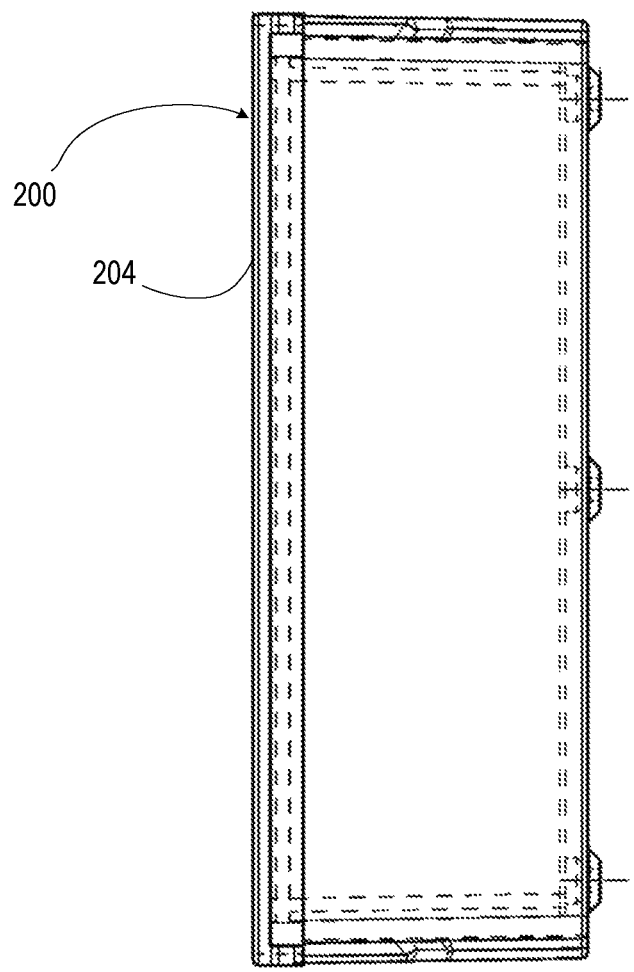
FIG. 8 is a right side view of the housing of FIG. 5, according to one or more embodiments.
Figure 9:
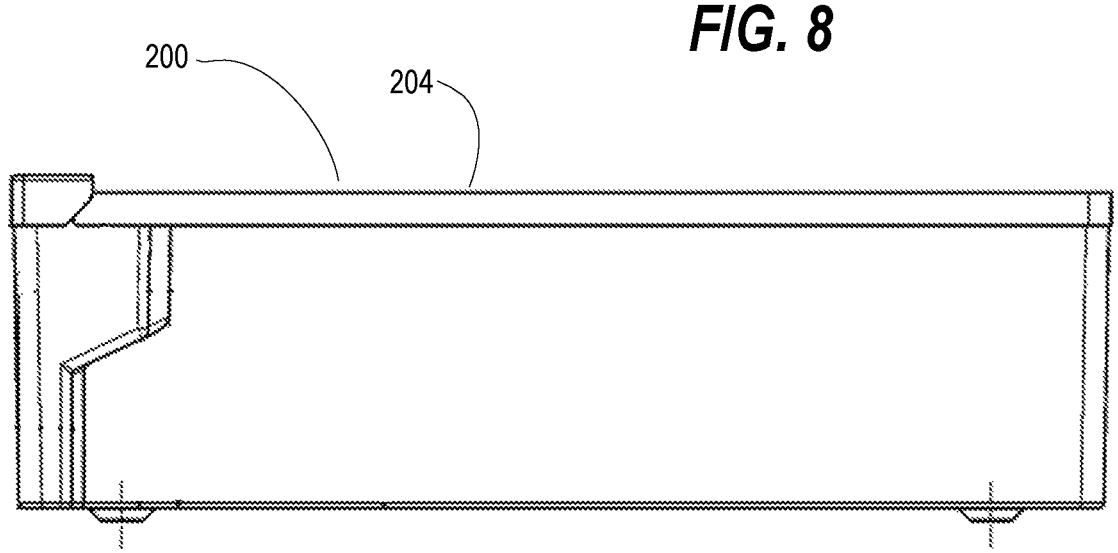
FIG. 9 is a top view of the housing of FIG. 5, according to one or more embodiments.

FIGS. 2-10 depict an example electrical safe enclosure 200 made using the method 100 of FIG. 1 to solve the problem of electric enclosures that rust or deteriorate due to weather, salt from the ocean, roads or other poor environments. FIG. 2 is a front view of a cover 202 of the enclosure 200. FIG. 3 is horizontal cross section along lines A-A of the cover 202. FIG. 4 right side view of cover 202. FIG. 5 front view of a housing 204 of enclosure 200. FIG. 6 is a horizontal cross section along lines B-B of the housing 204. FIG. 6 shows the reverse taper 206 adapted to increase the enclosures resistance to weather and dust intrusion. FIG. 7 is an isometric view of the housing 204 adapted to accept a standard electrical meter and includes an embodiment with a weather head 208 and a mounting location for ground connector 210. FIG. 8 is a right side view of the housing 204. FIG. 9 is a top view of the housing 204.

Enclosure 200 is made in part of plastic, eliminating the problem of rust or deterioration, while having an ability to be electrically grounded like metal enclosure. Electrical resistance level is selected to reduce static electricity in the enclosure 200 and to mitigate static electricity being drawn to the enclosure 200 from outside sources. Enclosure 200 is made of a weather proof material that is based on polycarbonate, with stainless steel for conductivity and rubber for strength as the base material. Carbon fiber is added in a cold mix prior to molding to improve ground-ability.

Then a special process is employed to improve and control the impact resistance level and the general strength of the enclosure. The molding machine is modified with a 1-inch hole in the top of the molding machine barrel which is 1 inch from the end of the machine barrel. The added top port is used to meter up to 6% of an 90% carbon loaded polyethylene blend that acts as both: (i) a glue to hold everything together; and (ii) electrical ground-ability. At the same time, up to 5% Kevlar is added for increased strength. Kevlar is a commonly available fiber based material, but other aramid or prara-armid fiber yarns or mixtures could be used to increase the material strength properties of the material by those with knowledge of the arts. By adding to carbon loaded polyethylene in this fashion, the residence time in the heated molding machine barrel is limited. By putting this additive in at the last moment in the process, the material molecules maintain a tighter configuration and are not spread out like the material molecules would be if moved through the entire length of the barrel. The end result of this process enables control of the resistance level in the end product. By adding or subtracting from the carbon filled polyethylene, the electrical resistance can be adjusted up or down as needed for the application. The finished parts are then tested for grounding and resistance with a meager tester. Grounding is consistent and does not need this step for the part to be ground-able however the consistency of grounding throughout the surface of the parts is much improved as a bi-product of this process. However, this process is the key to controlling the resistance. The attraction of static electricity to this product is controlled for use it in special environments.

The Kevlar, or other strength adding fiber based material that is added at the same time through the same 1 inch hole in the barrel is added to improve strength at the end of the process to eliminate residence time in the molding barrel. The limited residence time avoids damage to the Kevlar in the material mixture that would occur if allowed to travel the full length of the barrel, picking up both residence heat from the barrel heat and sheer heat generated by rotation of a screw. The melt temperature is approximately 540 degrees Fahrenheit. The material added in the special process picks up the required heat to be molded at the last second prior to being injected into the mold. Again, this is what allows us to control the resistance by adding the carbon loaded polyethylene and keeping those molecules in a tight pattern.

In one or more embodiments, a special process used to mold the weather head and the reverse taper on the lip for the cover is accomplished by using a hand loaded insert which is used to create the solid weather head on the box and the reverse taper that creates a weather proof seal between the box and the door. At the end of each molding cycle when the operator removes the part from the molding machine. The operator takes the part, positions it on a fixture mounted to a work bench at the molding machine. Once the part is held securely in the fixture, the insert is removed leaving the solid molded box with no open seams. This creates a solid weather proof head and a reverse taper to seal against the lip of the cover. Once the insert is removed the operator loads it back into the mold onto specific core pins, closes the machine door, pushes cycle and the machine begins the next molding cycle. Approximately a 45 second cycle. Mold temperatures are set using a thermolator set to 180 degrees Fahrenheit. After molding, hardware is added by the operator as needed to complete the box assembly.

In one or more embodiments, the enclosure 200 has a solid molded weather head 205 created by the use of a hand loaded insert. By making this solid one-piece product, no moisture can inter through the weather head. Standard boxes are two pieces that are spot welded together creating an area for moisture to enter. Cover and box have a complementary reverse taper 206 to eliminate any possibility of water getting into the box through the seal at the top of the cover. Standard boxes have a straight flat seal with cracks that allow moisture to enter.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming at least a portion of an electrically conductive enclosure comprising:
  mixing an electrically conductive material with a polycarbonate material to produce an injection mixture;
  blending carbon black to produce an electrically conductive additive to control the electrical conductivity of the enclosure;
  providing an injection mold having a configuration of the at least portion of the enclosure;
  introducing the electrically conductive additive to at least partially mix with the injection mixture prior to molding; and
  injecting the injection mixture into the injection mold to form the at least portion of the enclosure.

2. The method of claim 1, wherein the electrically conductive material is selected from a group consisting ferrous metals, non-ferrous metals, and mixtures thereof.

3. The method of claim 1, where the injection material includes at least one material to provide impact resistance to the enclosure.

4. The method of claim 1, further comprising,
  blending the carbon black with polyethylene up to 90% by volume carbon black powder and down to 10% by volume polyethylene.

5. The method of claim 1, wherein the electrically conductive additive comprises from 1% to 15% by volume of a final volume of the injection mixture.

6. The method of claim 1, wherein the carbon black is substituted with a different additive adapted for controlling an electrical resistivity of the enclosure.

7. The method of claim 1, wherein the injection mixture includes at least one material to increase a material strength of the enclosure.

8. The method of claim 7, wherein the at least one material to increase the material strength of the enclosure is selected from a group consisting of Kevlar, aramid fiber-based material, para-aramid yarns, and mixtures thereof.

9. The method of claim 7, wherein the at least one material to increase the material strength of the enclosure comprises from 1% to 5% of a final volume of the injection mixture.

* * * * *